United States Patent
Ota

(10) Patent No.: US 9,570,215 B2
(45) Date of Patent: Feb. 14, 2017

(54) METHOD FOR MANUFACTURING PRECURSOR, METHOD FOR MANUFACTURING SUPERCONDUCTING WIRE, PRECURSOR, AND SUPERCONDUCTING WIRE

(71) Applicants: Sumitomo Electric Industries, Ltd., Osaka-shi, Osaka (JP); Toyo Kohan Co., Ltd., Tokyo (JP)

(72) Inventor: Hajime Ota, Osaka (JP)

(73) Assignees: Sumitomo Electric Industries, Ltd., Osaka-shi, Osaka (JP); TOYO KOHAN CO., LTD., Tokyo (JP)

( * ) Notice: Subject to any disclaimer, the term of this patent is extended or adjusted under 35 U.S.C. 154(b) by 169 days.

(21) Appl. No.: 14/451,812

(22) Filed: Aug. 5, 2014

(65) Prior Publication Data

US 2014/0342917 A1    Nov. 20, 2014

Related U.S. Application Data

(63) Continuation of application No. 14/091,460, filed on Nov. 27, 2013, now Pat. No. 8,865,627, which is a (Continued)

(30) Foreign Application Priority Data

Nov. 28, 2008   (JP) ................. 2008-304153

(51) Int. Cl.
*H01B 12/06*    (2006.01)
*H01L 39/24*    (2006.01)

(52) U.S. Cl.
CPC .......... *H01B 12/06* (2013.01); *H01L 39/2454* (2013.01); *Y10T 428/12535* (2015.01);
(Continued)

(58) Field of Classification Search
CPC .......................... H01B 12/06; H01L 39/2454
(Continued)

(56) References Cited

U.S. PATENT DOCUMENTS 4,996,187 A * 2/1991 Chai ................... C30B 7/00
428/688
5,006,507 A   4/1991 Woolf et al.
(Continued)

FOREIGN PATENT DOCUMENTS

JP   64-089113   4/1989
JP   02-306509   12/1990
(Continued)

*Primary Examiner* — Colleen Dunn
(74) *Attorney, Agent, or Firm* — Drinker Biddle & Reath LLP

(57) ABSTRACT

A method for manufacturing a superconducting wire includes the following steps. A laminate metal having a first metal layer and a Ni layer formed on the first metal layer is prepared. An intermediate layer (20) is formed on the Ni layer of the laminate metal. A superconducting layer (30) is formed on the intermediate layer (20). By subjecting the laminate metal to a heat treatment after at least either of the step of forming a intermediate layer (20) and the step of forming a superconducting layer (30), a nonmagnetic Ni alloy layer (12) is formed from the laminate metal.

3 Claims, 4 Drawing Sheets

Related U.S. Application Data continuation of application No. 13/131,350, filed as application No. PCT/JP2009/069528 on Nov. 18, 2009, now abandoned.

(52) U.S. Cl.
CPC .................. *Y10T 428/12944* (2015.01); *Y10T 428/31678* (2015.04)

(58) Field of Classification Search
USPC ........ 505/230, 239, 236, 237, 238; 428/548, 428/554, 555, 561, 680
See application file for complete search history.

(56) References Cited

U.S. PATENT DOCUMENTS

| | | | | |
|---|---|---|---|---|
| 5,047,388 A | * | 9/1991 | Rohr | C04B 35/45 427/226 |
| 6,226,858 B1 | | 5/2001 | Matsumoto et al. | |
| 6,235,402 B1 | * | 5/2001 | Shoup | C21D 8/12 117/944 |
| 6,670,308 B2 | * | 12/2003 | Goyal | C25D 5/34 148/96 |
| 7,402,230 B2 | * | 7/2008 | Yoo | C25D 1/04 205/138 |
| 2004/0132624 A1 | * | 7/2004 | Wakata | H01L 39/2454 505/100 |
| 2007/0238619 A1 | * | 10/2007 | Xiong | H01L 39/2461 505/100 |
| 2008/0265255 A1 | * | 10/2008 | Goyal | B82Y 10/00 257/64 |
| 2010/0099573 A1 | * | 4/2010 | Aoki | C22C 5/06 505/230 |
| 2012/0040840 A1 | | 2/2012 | Okayama et al. | |

FOREIGN PATENT DOCUMENTS

| | | |
|---|---|---|
| JP | 11-003620 | 1/1999 |
| JP | 11-504612 | 4/1999 |
| JP | 2001-236834 A | 8/2001 |
| JP | 2006-127847 A | 5/2006 |
| JP | 2006-286212 A | 10/2006 |
| JP | 2007115562 A | 5/2007 |
| JP | 2007-200831 A | 8/2007 |
| JP | 2008-210600 A | 9/2008 |
| WO | WO-96/32201 A1 | 10/1996 |
| WO | WO-03/050826 A1 | 6/2003 |
| WO | WO-2010/055651 | 5/2010 |

* cited by examiner

US 9,570,215 B2

METHOD FOR MANUFACTURING PRECURSOR, METHOD FOR MANUFACTURING SUPERCONDUCTING WIRE, PRECURSOR, AND SUPERCONDUCTING WIRE

This application is a continuation application of U.S. application Ser. No. 14/091,460, filed Nov. 27, 2013, which is a continuation application of U.S. application Ser. No. 13/131,350, filed May 26, 2011, the entire contents of each of which are incorporated herein by reference. U.S. application Ser. No. 13/131,350 is a 371 National Stage of PCT/JP2009/069528, filed Nov. 18, 2009, which claims the benefit of Japanese Patent Application No. 2008-304153, filed Nov. 28, 2008.

TECHNICAL FIELD

The present method relates to a method for manufacturing a precursor, a method for manufacturing a superconducting wire, a precursor and a superconducting wire.

BACKGROUND ART

Conventionally, a superconducting wire having a substrate, an intermediate layer formed on the substrate, and a superconducting layer formed on the intermediate layer is used. As a substrate of such a superconducting wire, for example, Japanese Patent Laying-Open No. 2006-127847 (Patent Document 1), Japanese National Patent Publication No. 11-504612 (Patent Document 2) and the like are used.

Patent Document 1 discloses an orientation substrate for film formation including a non-orientated nonmagnetic first metal layer, and a second metal layer having a superficial layer with an oriented texture wherein the first metal layer has higher strength than the second metal layer. Patent Document 2 discloses a metal substrate having an alloyed biaxial orientation texture.

PRIOR ART DOCUMENTS

Patent Documents

Patent Document 1: Japanese Patent Laying-Open No. 2006-127847
Patent Document 2: Japanese National Patent Publication No. 11-504612

SUMMARY OF THE INVENTION

Problems to be Solved by the Invention

However, for manufacturing a superconducting wire using the substrates of Patent Documents 1 and 2, it is necessary to form an intermediate layer and a superconducting layer after forming the aforementioned substrate. When the first metal layer of Patent Document 1 and the metal substrate of Patent Document 2 are Ni (nickel) alloys, superficial layers of the first metal layer and the metal substrate will be oxidized if formation of intermediate layers is attempted on the substrates. There is a problem that oxidation of the superficial layer will disadvantageously hinder formation of an intermediate layer on the superficial layer.

When the first metal layer of Patent Document 1 is Ni, oxidation of the first metal layer is prevented. Therefore, an intermediate layer can be formed on the Ni layer, and hence a superconducting wire can be formed. However, since Ni is a ferromagnetic metal, the magnetic field toward the end in the widthwise direction of the superconducting wire concentrates due to the hysteresis loss of Ni. This leads a problem that the hysteresis loss of the superconducting wire increases.

Therefore, the present invention has been made to solve the aforementioned problems, and it is an object of the present invention to provide a method for manufacturing a precursor, a method for manufacturing a superconducting wire, a precursor and a superconducting wire capable of reducing the hysteresis loss.

Means for Solving the Problems

The method for manufacturing a precursor of the present invention includes the following steps. A laminate metal having a first metal layer and a Ni layer formed on the first metal layer is prepared. An intermediate layer is formed on the Ni layer of the laminate metal. By subjecting the laminate metal to a heat treatment after the step of forming an intermediate layer, a nonmagnetic Ni alloy layer is formed from the laminate metal.

The precursor of the present invention includes a nonmagnetic Ni alloy layer, and an intermediate layer formed on the nonmagnetic Ni alloy layer. In the nonmagnetic Ni alloy layer, the concentration of Ni monotonically reduces from an interface with the intermediate layer toward the surface opposite to the interface.

According to the method for manufacturing a precursor and the precursor of the present invention, the intermediate layer is formed on the Ni layer. Ni is hard to be oxidized, and shows excellent matching of lattice with the intermediate layer. Therefore, the intermediate layer can be easily formed on the Ni layer. By subjecting the laminate metal to a heat treatment in this condition, Ni constituting the Ni layer and the first metal constituting the first metal layer are alloyed, so that a Ni alloy can be formed. The magnetism of the Ni alloy can be made smaller than that of a simple substance of Ni. In other words, it is possible to form a nonmagnetic Ni alloy layer from the laminate metal. Therefore, when a superconducting wire is manufactured by forming a superconducting layer on the intermediate layer of the precursor, it is possible to lessen the concentration of the magnetic field toward the end in the widthwise direction of the superconducting wire by the nonmagnetic Ni alloy layer. Therefore, a precursor capable of reducing the hysteresis loss can be realized.

In the precursor manufactured by the aforementioned method for manufacturing a precursor, the nonmagnetic Ni alloy layer is formed from the laminate metal by subjecting the laminate metal to a heat treatment after the step of forming an intermediate layer. Therefore, the concentration of Ni monotonically reduces from an interface with the intermediate layer to the surface opposite to the interface in the nonmagnetic Ni alloy layer because of diffusion of Ni in the laminate metal.

Preferably, in the aforementioned method for manufacturing a precursor, a laminate metal in which a second metal layer having higher strength than the first metal layer is formed under the first metal layer is prepared in the step of preparing a laminate metal.

Preferably, the aforementioned precursor further includes a second metal layer formed under the nonmagnetic Ni alloy layer and having higher strength than the nonmagnetic Ni alloy layer.

Since the second metal layer has higher strength than the first metal layer, it is possible to improve the strength of the precursor compared to the case of the first metal layer alone.

Preferably, in the aforementioned method for manufacturing a precursor, the Ni layer has a thickness of 1 μm or more and 10 μm or less in the step of preparing a laminate metal.

When it is 1 μm or more, diffusion of Ni in the step of forming an intermediate layer is prevented, so that the function of the Ni layer that it is hard to be oxidized and shows excellent matching of lattice with the intermediate layer can be effectively exerted. When it is 10 μm or less, Ni constituting the Ni layer easily diffuses to the first metal layer in the step of forming a nonmagnetic Ni diffused layer, so that it is possible to prevent Ni from remaining as a simple substance of Ni effectively.

The method for manufacturing a superconducting wire of the present invention includes the following steps. A laminate metal having a first metal layer, and a Ni layer formed on the first metal layer is prepared. An intermediate layer is formed on the Ni layer of the laminate metal. A superconducting layer is formed on the intermediate layer. A nonmagnetic Ni alloy layer is formed from the laminate metal by subjecting the laminate metal to a heat treatment after at least either one of the step of forming an intermediate layer, and the step of forming a superconducting layer.

The superconducting wire of the present invention includes the aforementioned precursor, and a superconducting layer formed on an intermediate layer.

According to the method for manufacturing a superconducting wire and the superconducting wire of the present invention, the intermediate layer is formed on the Ni layer. Ni is hard to be oxidized, and shows excellent matching of lattice with the intermediate layer. Therefore, it is possible to easily form the intermediate layer on the Ni layer. By subjecting the laminate metal to a heat treatment after at least either of this state and the state where a superconducting layer is further formed, Ni constituting the Ni layer and the first metal constituting the first metal layer are alloyed, so that a Ni alloy can be formed. The magnetism of the Ni alloy can be made smaller than that of a simple substance of Ni. In other words, it is possible to form a nonmagnetic Ni alloy layer from the laminate metal. Therefore, it is possible to lessen the concentration of the magnetic field toward the end in the widthwise direction of the superconducting wire by the nonmagnetic Ni alloy layer. Therefore, a superconducting wire capable of reducing the hysteresis loss can be realized.

Preferably, in the aforementioned method for manufacturing a superconducting wire, a laminate metal in which a second metal layer having higher strength than the first metal layer is formed under the first metal layer is prepared in the step of preparing a laminate metal.

Since the second metal layer has higher strength than the first metal layer, it is possible to improve the strength of the superconducting wire compared to the case of the first metal layer alone.

Preferably, in the aforementioned method for manufacturing a superconducting wire, the Ni layer has a thickness of 1 μm or more and 10 μm or less in the step of preparing a laminate metal.

When it is 1 μm or more, diffusion of Ni in the step of forming an intermediate layer can be prevented, so that the function of the Ni layer that it is hard to be oxidized and shows excellent matching of lattice with the intermediate layer can be effectively exerted. When it is 10 μm or less, Ni constituting the Ni layer easily diffuses to the first metal layer in the step of forming a nonmagnetic Ni diffused layer, so that it is possible to prevent Ni from remaining as a simple substance of Ni effectively.

Effects of the Invention

As described above, according to the method for manufacturing a precursor, the method for manufacturing a superconducting wire, the precursor and the superconducting wire of the present invention, it is possible to reduce the hysteresis loss.

MODES FOR CARRYING OUT THE INVENTION

Figure 1:
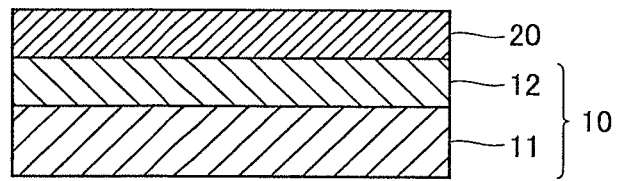
FIG. 1 is a sectional view schematically showing a precursor in Embodiment 1 of the present invention.

In the following, embodiments of the present invention will be described with reference to the drawings. In the following drawings, an identical or corresponding part will be denoted by the same reference numeral, and description thereof will not be repeated.

(Embodiment 1)

FIG. 1 is a sectional view schematically showing a precursor in one embodiment of the present invention. Referring to FIG. 1, the precursor of the present embodiment will be described. As shown in FIG. 1, the precursor has a substrate 10 including a second metal layer 11 and a nonmagnetic Ni alloy layer 12 formed on second metal layer 11, and an intermediate layer 20 formed on nonmagnetic Ni alloy layer 12.

Substrate 10 has a shape of long tape. Substrate 10 includes second metal layer 11 and nonmagnetic Ni ally layer 12.

Nonmagnetic Ni alloy layer 12 is made of a nonmagnetic metal. The Ni alloy constituting nonmagnetic Ni alloy layer 12 is not particularly limited, however, it is preferably a Cu (copper)—Ni alloy and an Ag (silver)—Ni alloy. Preferably, the nonmagnetic Ni alloy layer is oriented.

Nonmagnetic Ni alloy layer 12 has lower magnetism than a magnetism of Ni material. In other words, both the case where the magnetism of the non-magnetic Ni alloy layer is 0 J/m³, and the case where the magnetism is low but still exceeding 0 J/m³, it is still lower than the magnetism of Ni material.

In nonmagnetic Ni alloy layer 12, there is a Ni concentration distribution. Concretely, in nonmagnetic Ni alloy layer 12, the concentration of Ni monotonically reduces from an interface with intermediate layer 20 toward the surface opposite to the interface. The monotonic reduction means that the Ni concentration is constant or reduces from the interface with intermediate layer 20 toward the surface opposite to the interface, and the Ni concentration is lower in the surface opposite to the interface than in the interface with intermediate layer 20. That is, the monotonic reduction excludes the part where the Ni concentration increases toward this direction.

Second metal layer 11 is formed under nonmagnetic Ni alloy layer 12 and has higher mechanical strength than nonmagnetic Ni alloy layer 12. Preferably, second metal layer 11 has such a strength that it will not elongate under tension at high temperature during formation of a superconducting layer. As such second metal layer 11, stainless is preferably used. Second metal layer 11 may be omitted.

Intermediate layer 20 is a layer provided for formation of a superconducting layer on its surface. Intermediate layer 20 is made up of one layer or two or more layers. When intermediate layer 20 is made up of a plurality of layers, the individual layers constituting intermediate layer 20 may be constituted by different materials. Intermediate layer 20 may be an oxide having at least one crystal structure selected from rock-salt type, fluorite type, perovskite type, and pyrochlore type. Examples of a material having such a crystal structure include rare earth element oxides such as cerium oxide ($CeO_2$), holmium oxide ($Ho_2O_3$), yttrium oxide ($Y_2O_3$) and ytterbium oxide ($Yb_2O_3$), yttria-stabilized zirconia (YSZ), magnesium oxide (MgO) and Ln-M-O compounds (Ln represents one or more lanthanoid elements, M represents one or more elements selected from Sr, Zr and Ga, and O represents oxygen) such as strontium titanate ($SrTiO_3$), BZO ($BaZrO_3$) and aluminum oxide ($Al_2O_3$).

Also, intermediate layer 20 preferably has excellent crystal orientation. Further, intermediate layer 20 is preferably a material capable of preventing a reaction with an element constituting the superconducting layer and diffusion. Examples of such a material include $CeO_2$. The material constituting intermediate layer 20 is not particularly limited to the above material.

Figure 2:
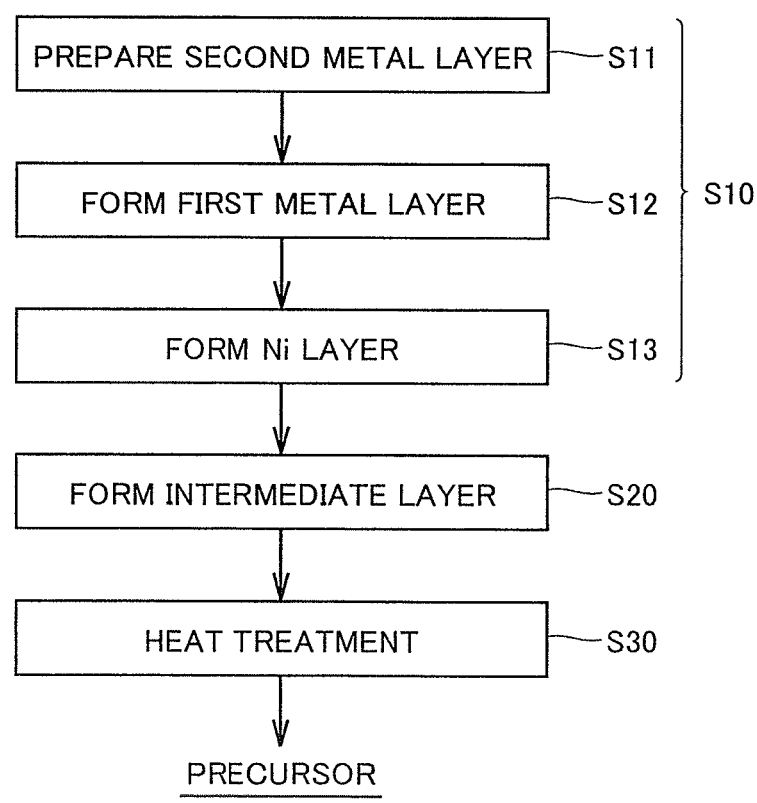
FIG. 2 is a flowchart showing a method for manufacturing a precursor in Embodiment 1 of the present invention.

FIG. 2 is a flowchart showing a method for manufacturing a precursor in the present embodiment. Next, with reference to FIG. 2, the method for manufacturing a precursor in the present embodiment will be described.

Figure 3:
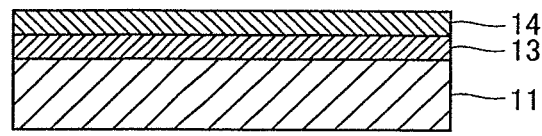
FIG. 3 is a sectional view schematically showing a laminate substrate in Embodiment 1 of the present invention.

FIG. 3 is a sectional view schematically showing a laminate substrate in the present embodiment. As shown in FIG. 2 and FIG. 3, first, a laminate metal having a first metal layer 13, and a Ni layer 14 formed on first metal layer 13 is prepared (Step S10). In the present embodiment, a laminate metal including a second metal layer 11 having higher strength than first metal layer 13 formed under first metal layer 13 is prepared.

Concretely, first, second metal layer 11 is prepared (Step S11). Second metal layer 11 is a layer for imparting strength. As such second layer 11, for example, the materials as described above may be used. The thickness of second metal layer 11 is, for example, 100 μm.

Next, first metal layer 13 is formed on second metal layer 11 (Step S12). First metal layer 13 is preferably a metal having excellent orientation such as Cu or Ag. Also first metal layer 13 is preferably oriented. The thickness of first metal layer 13 is, for example, 18 μm.

A method for forming first metal layer 13 is not particularly limited, and for example, a method for bonding first metal layer 13 and second metal layer 11 may be employed.

Thereafter, Ni layer 14 is formed on first metal layer 13 (Step S13). Ni layer 14 is a layer for preventing oxidation during formation of the intermediate layer. When first metal layer 13 is oriented, Ni layer 14 formed thereon is also oriented. The thickness of Ni layer 14 is, for example, 1 μm. A method for forming Ni layer 14 is not particularly limited, and for example, a plating method may be employed.

The thickness of Ni layer 14 is preferably 1 μm or more and 10 μm or less. When it is 1 μm or more, it is possible to prevent Ni from diffusing even when heat of about 600° C. is added in Step S20 for forming intermediate layer 20 as will be described later. Therefore, it is possible that the Ni layer 14, a layer that it is hard to be oxidized, still shows excellent matching of lattice with the intermediate layer. When the Ni layer 14 has a thickness of 10 μm or less, since Ni constituting Ni layer 14 easily diffuses to first metal layer 13 in Step S30 of forming nonmagnetic Ni alloy layer 12 as will be described later, it is possible to effectively prevent Ni from remaining as a simple Ni material.

By Steps S11 to S13, the laminate metal shown in FIG. 3 can be prepared (Step S10).

Figure 4:
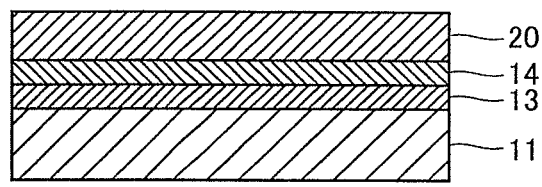
FIG. 4 is a sectional view schematically showing the state where an intermediate layer is formed on a laminate metal in Embodiment 1 of the present invention.

FIG. 4 is a sectional view schematically showing the state where an intermediate layer is formed on a laminate metal in the present embodiment. As shown in FIG. 2 and FIG. 4, next, intermediate layer 20 is formed on Ni layer 14 of the laminate metal (Step S20). Since Ni layer 14 is hard to be oxidized, it is possible to easily form intermediate layer 20.

When first metal layer 13 is oriented, Ni layer 14 formed thereon is oriented, and thus intermediate layer 20 formed on Ni layer 14 is also oriented. Therefore, it is possible to form intermediate layer 20 having excellent orientation.

A method for forming intermediate layer 20 is not particularly limited, and for example, a sputtering method may be employed. Also, intermediate layer 20, for example, of the material as described above is formed.

As shown in FIG. 2, next, after the step of forming intermediate layer 20 (Step S20), nonmagnetic Ni alloy layer 12 is formed from the laminate metal by subjecting the laminate metal to a heat treatment (Step S30). By Step S30, Ni of Ni layer 14 is allowed to diffuse in first metal layer 13 to make an alloy of Ni and the first metal, to form nonmagnetic Ni alloy layer 12. When the first metal constituting first metal layer 13 is Cu or Ag, nonmagnetic Ni alloy layer 12 is a Ni—Cu alloy or a Ni—Ag alloy.

A condition for the heat treatment is not particularly limited as far as Ni constituting Ni layer 14 and the first metal constituting first metal layer 13 are alloyed in the laminate metal. As one example of the condition for the heat treatment, for example, a treatment is executed for about 1 hour at a temperature of 600° C. or higher and 800° C. or lower in an atmosphere containing Ar (argon) under a pressure of 10 Pa or less.

When first metal layer 13 is Cu, a nonmagnetic Ni—Cu alloy layer containing Ni constituting Ni layer 14 of 50% or less with respect to Cu constituting first metal layer 13 can be formed in alloying by the heat treatment.

By executing Steps S10 to S30, it is possible to manufacture the precursor shown in FIG. 1. Here, the precursor to be manufactured also includes the case where part of first metal layer 13 is not alloyed by the heat treatment in Step S30. In other words, the precursor of the present invention may include second metal layer 11, first metal layer 13 formed on second metal layer 11, nonmagnetic Ni alloy layer 12 formed on first metal layer 13, and intermediate layer 20 formed on nonmagnetic Ni alloy layer 12.

As described above, according to the precursor and its manufacturing method in the present embodiment, nonmagnetic Ni alloy layer 12 is formed from the laminate metal by subjecting the laminate metal to the heat treatment after Step S20 of forming intermediate layer 20 (Step S30).

Ni is hard to be oxidized, and shows excellent matching of lattice with intermediate layer 20. Therefore, it is possible to easily form intermediate layer 20 on Ni layer 14. By subjecting the laminate metal to the heat treatment in this state, the Ni material constituting Ni layer 14 and the first metal constituting first metal layer 13 are alloyed, so that a Ni alloy can be formed. The magnetism of the Ni alloy can be made smaller than that of a simple substance of Ni. In other words, it is possible to form nonmagnetic Ni alloy layer 12 from the laminate metal. Therefore, when a superconducting wire is manufactured by forming the superconducting layer on intermediate layer 20 of the precursor, it is possible to reduce the concentration of the magnetic field toward the end in the widthwise direction of the superconducting wire by nonmagnetic Ni alloy layer 12. Therefore, a precursor capable of reducing the hysteresis loss can be realized.

Further, it is possible to prevent the superficial layer of Ni layer 14 from being oxidized during formation of intermediate layer 20. As a consequence, it is possible to prevent deterioration of the orientation of the intermediate layer formed on the superficial layer where oxidation is prevented. In other words, when first metal layer 13 has excellent orientation, the orientation of intermediate layer 20 formed thereon is also excellent. Therefore, it is possible to form intermediate layer 20 and the superconducting layer having excellent crystallinity. Also, by manufacturing a superconducting wire using this precursor, deterioration of the superconducting characteristics can be prevented.

(Embodiment 2)

Figure 5:
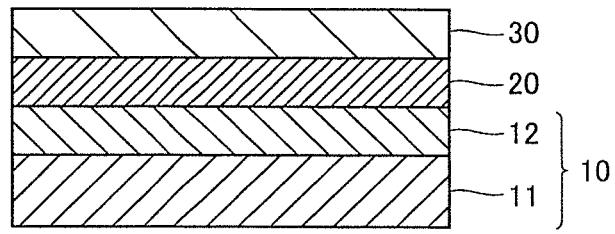
FIG. 5 is a sectional view schematically showing a superconducting wire in Embodiment 2 of the present invention.

FIG. 5 is a sectional view schematically showing a superconducting wire in the present embodiment. Referring to FIG. 5, the superconducting wire in the present embodiment will be described. As shown in FIG. 5, the superconducting wire in the present embodiment has the precursor in Embodiment 1, and a superconducting layer 30 formed on intermediate layer 20 of the precursor. That is, the superconducting wire has second metal layer 11, nonmagnetic Ni alloy layer 12 formed on second metal layer 11, intermediate layer 20 formed on nonmagnetic Ni alloy layer 12, and superconducting layer 30 formed on intermediate layer 20.

Superconducting layer 30 has a shape of long tape. Superconducting layer 30 is a superconductor represented by $REBa_2Cu_3O_y$, (y is 6 to 8, more preferably about 7, and RE means a rare earth element such as Y (yttrium), or Gd (gadolinium), Sm (samarium), Ho (holmium) or the like) or the like, and preferably includes GdBCO, for example. GdBCO is represented as $GdBa_2Cu_3O_y$ (y is 6 to 8, and more preferably about 7).

The superconducting wire may further have a stabilization layer (not illustrated) formed on superconducting layer 30. The stabilization layer is a contact part with an external electrode, while it protects superconducting layer 30. A material for the stabilization layer is not particularly limited, however, for example, Ag (silver), Cu (copper) or the like may be used.

Figure 6:
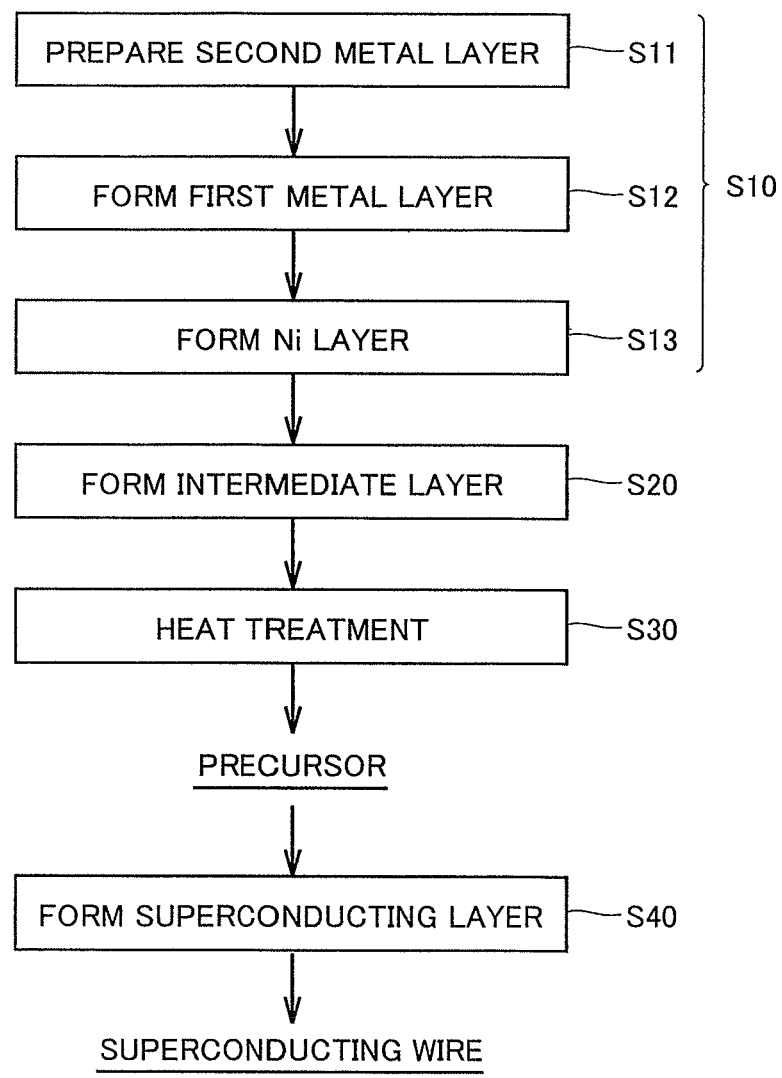
FIG. 6 is a flowchart showing a method for manufacturing a superconducting wire in Embodiment 2 of the present invention.

FIG. 6 is a flowchart showing a method for manufacturing a superconducting wire in the present embodiment. Next, with reference to FIG. 6, the method for manufacturing a superconducting wire in the present embodiment will be described.

First, the precursor shown in FIG. 1 is manufactured similarly to Embodiment 1 (Steps S10 to S30).

Next, as shown in FIG. 6, superconducting layer 30 is formed on intermediate layer 20 (Step S40). A method for forming superconducting layer 30 is not particularly limited, and for example, the PLD (Pulsed Laser Deposition) method, the MOD (Metal Organic Deposition) method and the like can be employed. Also, superconducting layer 30 of, for example, the material as described above is formed.

Next, on superconducting layer 30, the stabilization layer (not illustrated) of the material as described above may be formed. This step may be omitted.

By executing Steps S10 to S40, it is possible to manufacture the superconducting wire shown in FIG. 5.

As described above, in the superconducting wire and its manufacturing method in the present embodiment, nonmagnetic Ni alloy layer 12 is formed from the laminate metal by subjecting the laminate metal to a heat treatment after Step S20 of forming an intermediate layer (Step S30).

As described above, it is possible to easily form intermediate layer 20 on Ni layer 14. By subjecting the laminate metal to the heat treatment (Step S30) after forming intermediate layer 20 (Step S20), it is possible to form nonmagnetic Ni alloy layer 12. Since superconducting layer 30 is formed (Step S40) in this state, it is possible to form superconducting layer 30 easily. Therefore, it is possible to lessen the concentration of the magnetic field toward the end in the widthwise direction of the superconducting wire by nonmagnetic Ni alloy layer 12. Therefore, a superconducting wire capable of reducing the hysteresis loss can be realized.

(Embodiment 3)

Since the superconducting wire in the present embodiment is similar to the superconducting wire in Embodiment 2 shown in FIG. 5, the description thereof will not be repeated.

Figure 7:
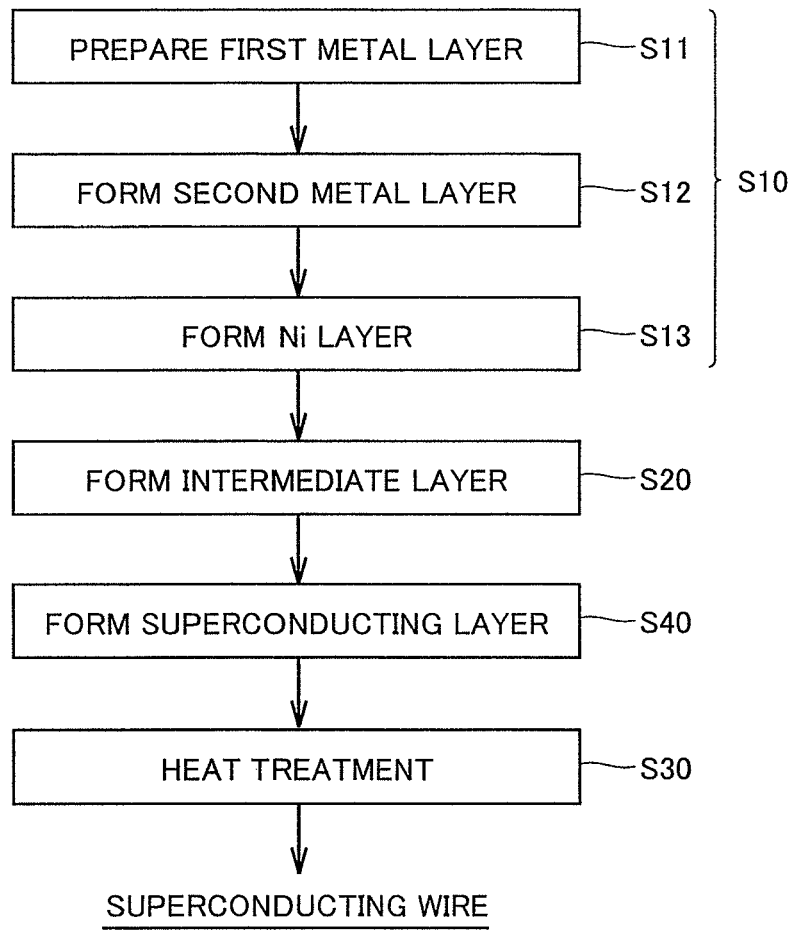
FIG. 7 is a flowchart showing a method for manufacturing a superconducting wire in Embodiment 3 of the present invention.

FIG. 7 is a flowchart showing a method for manufacturing a superconducting wire in the present embodiment. Next, referring to FIG. 7, the method for manufacturing a superconducting wire in the present embodiment will be described.

As shown in FIG. 7, first, a laminate metal having first metal layer 13, and Ni layer 14 formed on first metal layer 13 is prepared (Step S10). Next, intermediate layer 20 is formed on Ni layer 14 of the laminate metal (Step S20). Since Steps S10 and S20 are similar to those in Embodiment 1, the description thereof will not be repeated.

Figure 8:
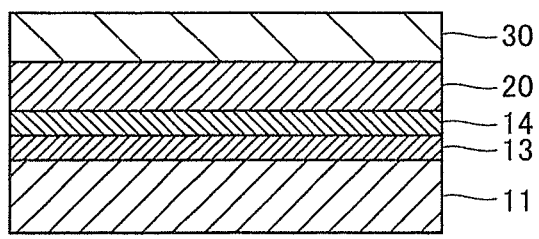
FIG. 8 is a sectional view schematically showing the state where a superconducting layer is formed in Embodiment 3 of the present invention.

FIG. 8 is a sectional view schematically showing the state where a superconducting layer in the present embodiment is formed. As shown in FIG. 7 and FIG. 8, next, superconducting layer 30 is formed on intermediate layer 20 (Step S40). Since Step S40 is similar to that in Embodiment 2, the description thereof will not be repeated.

Next, nonmagnetic Ni alloy layer 12 is formed from the laminate metal by subjecting the laminate metal to a heat treatment after Step S40 of forming superconducting layer 30 (Step S30). Since Step S30 is similar to that in Embodiment 1, the description thereof will not be repeated.

By executing Steps S10 to S50, the superconducting wire shown in FIG. 5 can be manufactured.

The laminate metal may be subjected to a heat treatment after forming intermediate layer 20. In other words, Step S30 of conducting a heat treatment may be executed after Step S20 of forming intermediate layer 20 and Step S40 of forming superconducting layer 30.

As described above, in the superconducting wire and its manufacturing method in the prevent embodiment, nonmagnetic Ni alloy layer 12 is formed from the laminate metal by subjecting the laminate metal to a heat treatment after Step S40 of forming the superconducting layer (Step S30).

As described above, it is possible to easily form intermediate layer 20 on Ni layer 14. Therefore, it is possible to easily form superconducting layer 30 on intermediate layer 20. By subjecting the laminate metal to a heat treatment (Step S30) after forming superconducting layer 30 (Step S40), it is possible to form nonmagnetic Ni alloy layer 12. Therefore, it is possible to lessen the concentration of the magnetic field toward the end in the widthwise direction of the superconducting wire by nonmagnetic Ni alloy layer 12. Therefore, a superconducting wire capable of reducing the hysteresis loss can be realized.

EXAMPLE

In the present example, the effect of having the step of forming a nonmagnetic Ni alloy layer from a laminate metal by subjecting the laminate metal to a heat treatment after at least either one of the step of forming an intermediate layer and the step of forming a superconducting layer was examined.

Invention Example 1

The superconducting wire of Inventive Example 1 was manufactured according to Embodiment 2. Concretely, first, as first metal layer 13, a Cu substrate having a thickness of 18 μm was prepared (Step S12). Ni layer 14 having a thickness of 1 μm was formed on first metal layer 13 by plating (Step S13). As a result, a laminate metal wherein the Cu substrate which is first metal layer 13 and Ni layer 14 were laminated was formed.

Next, $CeO_2$ was formed on Ni layer 14 as intermediate layer 20 by sputtering (Step S20).

Next, the laminate substrate was subjected to a heat treatment under a pressure of 10 Pa or less, at a temperature of 700° C. in an atmosphere containing Ar (Step S30). In this manner, a nonmagnetic Ni—Cu alloy layer was formed from the laminate metal.

Next, GdBCO was formed as superconducting layer 30 on intermediate layer 20 by the PLD method (Step S40).

By executing Steps S10 to S40, a superconducting wire in which the Ni concentration monotonically reduces from an interface with the intermediate layer toward the surface opposite to the interface in the nonmagnetic Ni alloy layer of Inventive Example 1 was manufactured.

Inventive Example 2

The method for manufacturing a superconducting wire of Inventive Example 2 was basically similar to the method for manufacturing a superconducting wire of Inventive Example 1, but was different in that it was manufactured according to the method for manufacturing a superconducting wire in Embodiment 3. In other words, the method for manufacturing a superconducting wire of Inventive Example 2 was different from Inventive Example 1 in that Step S30 of conducting a heat treatment was executed after Step S40 of forming superconducting layer 30.

Comparative Example 1

The method for manufacturing a superconducting wire of Comparative Example 1 was basically similar to the method for manufacturing a superconducting wire of Inventive Example 1, but was different in that Step S30 of conducting a heat treatment was not executed.

Measuring Method

The hysteresis loss and the critical current Ic were measured for each of the superconducting wires of Inventive Examples 1, 2 and Comparative Example 1. The results are shown in Table 1.

Concretely, the critical current Ic of each of the superconducting wires of Inventive Examples 1, 2 and Comparative Example 1 was measured at a temperature of 77K in a self-magnetic field. An electric current when an electric field of $10^{-6}$ V/cm occurs was determined as the critical current Ic.

For the superconducting wires of Inventive Examples 1, 2 and Comparative Example 1, the hysteresis loss when a magnetic field was applied in the direction parallel to the tape face of the superconducting wire was measured at room temperature using a vibrating sample magnetometer (VSM).

TABLE 1

|  | Heat treatment | Hysteresis loss | Critical current Ic |
| --- | --- | --- | --- |
| Inventive Example 1 | After formation of intermediate layer | 0 $J/m^3$ | 250 A/cm |
| Inventive Example 2 | After formation of superconducting layer | 0 $J/m^3$ | 250 A/cm |
| Comparative Example 1 | Not executed | 53 $J/m^3$ | 250 A/cm |

(Measurement Result)

In Inventive Examples 1, 2 and Comparative Example 1, oxidation of the Ni layer could be prevented because the intermediate layer was formed on the Ni layer. Therefore, it was possible to easily form the intermediate layer.

Also, as shown in Table 1, in the superconducting wires of Inventive Example 1 in which the heat treatment was conducted after formation of the intermediate layer and of Inventive Example 2 in which the heat treatment was conducted after formation of the superconducting layer, a nonmagnetic Ni—Cu alloy layer could be formed by alloying Ni and Cu. Therefore, the hysteresis losses of the superconducting wires of Inventive Examples 1 and 2 were 0 $J/m^3$. On the other hand, the hysteresis loss of the superconducting wire of Comparative Example 1 in which a heat treatment was not conducted was 52 $J/m^3$. Accordingly, it was confirmed that the hysteresis loss can be reduced by subjecting the laminate metal to a heat treatment after at least either one of Step S20 of forming an intermediate layer and Step S40 of forming a superconducting layer.

Also as shown in Table 1, the critical currents Ic of the superconducting wires of Inventive Examples 1 and 2 were 250 A/cm that was equivalent to the critical current Ic of the superconducting wire of Comparative Example 1. Accordingly, it was confirmed that the superconducting characteristics of the superconducting layer will not be impaired even when the heat treatment is conducted after at least either one of Step S20 of forming an intermediate layer and Step S40 of forming a superconducting layer.

It should be considered that the embodiments and examples disclosed herein are given in every respect for exemplification rather than limitation. The scope of the present invention is defined by claims rather than by the embodiments described above, and equivalent meanings to the claims and every modification within the scope are intended to be implied.

DESCRIPTION OF THE REFERENCE SIGNS

10 Substrate, 11 Second metal layer, 12 Nonmagnetic Ni alloy layer, 13 First metal layer, 14 Ni layer, 20 Intermediate layer, 30 Superconducting layer

The invention claimed is:

1. A multilayer structure comprising:
a single nickel alloy layer which has lower magnetism than a simple substance of Ni, wherein said single nickel alloy layer consists of (i) a first metal and (ii) nickel that is not oxidized in a superficial layer of said nickel alloy layer, and wherein said single nickel alloy layer does not include a simple substance of nickel; and
an intermediate layer formed on said single nickel alloy layer, wherein
in said single nickel alloy layer, the concentration of nickel monotonically reduces from an interface with said intermediate layer towards the surface opposite to said interface.

2. The multilayer structure according to claim 1, further comprising a second metal layer formed under said single nickel alloy layer which has lower magnetism than a simple substance of Ni and having higher strength than said single nickel alloy layer;
said intermediate layer including at least one of:
  i) rare earth element oxides which include cerium oxide ($CeO_2$), holmium oxide ($Ho_2O_3$), yttrium oxide ($Y_2O_3$) and ytterbium oxide ($Yb_2O_3$); or
  ii) yttria-stabilized zirconia (YSZ), magnesium oxide (MgO), and Ln-M-O compounds (Ln represents one or more lanthanoid elements, M represents one or more elements selected from Sr, Zr and Ga, and O represents oxygen) which include strontium titanate ($SrTiO_3$), BZO ($BaZrO_3$) and aluminum oxide ($Al_2O_3$).

3. A superconducting wire comprising:
the multilayer structure of claim 1, and
a superconducting layer formed on an intermediate layer.

* * * * *